United States Patent [19]
Kagey

[11] Patent Number: 5,459,465
[45] Date of Patent: Oct. 17, 1995

[54] SUB-RANGING ANALOG-TO-DIGITAL CONVERTER

[75] Inventor: Mark R. Kagey, Ft. Collins, Colo.

[73] Assignee: Comlinear Corporation, Ft. Collins, Colo.

[21] Appl. No.: 140,675

[22] Filed: Oct. 21, 1993

[51] Int. Cl.⁶ .................................................. H03M 1/20
[52] U.S. Cl. ............................................................. 341/156
[58] Field of Search .................................... 341/156, 155, 341/144, 145; 307/360, 361, 362

[56] References Cited

U.S. PATENT DOCUMENTS

| | | | |
|---|---|---|---|
| 4,409,497 | 10/1983 | Nagano | 307/360 |
| 4,528,591 | 7/1985 | Liepe et al. | 358/160 |
| 4,827,191 | 5/1989 | Chapman | 341/132 |
| 4,928,103 | 5/1990 | Lane | 341/159 |
| 4,978,957 | 12/1990 | Hotta et al. | 341/156 |

OTHER PUBLICATIONS

Kazunori Tsugaru, Yasuhiro Sugimoto, Makoto Noda, Hiroshi Iwai, Gen Sasaki and Yoshito Suwa, "A 10BIT 40MHz ADC Using 0.8um BI-CMOS Technology," pp. 48–51 IEEE, 1989 (place of publication not indicated).

*Primary Examiner*—Brian K. Young

[57] ABSTRACT

The present invention provides a sub-ranging analog-to-digital (A/D) converter with improved speed and power consumption characteristics relative to known sub-ranging converters. The sub-ranging A/D converter utilizes information relating to the values of the bits determined in one stage to define the range of operation for a subsequent stage. In one embodiment, the subsequent stage utilizes three-input comparators in determining the value of a bit. Two of the inputs are used to receive signals representative of the upper and lower limits of the range of operation that has been determined by the prior stage and the other input is used to receive the analog signal. The three-input comparator operates to produce an output signal that is indicative of the relationship of the analog signal to a threshold level within the defined range of operation determined by the prior stage.

39 Claims, 5 Drawing Sheets

SUB-RANGING ANALOG-TO-DIGITAL CONVERTER

BACKGROUND OF THE INVENTION

1. Field of the Invention

The present invention relates to sub-ranging analog-to-digital (A/D) converters that convert an analog signal to a multi-bit digital signal in series of stages, with each stage determining a less significant bit or bits of the digital signal than the preceding stage and at least one stage determining more than one bit of the digital signal.

2. Description of the Related Art

A digital signal is a signal that must be in one of two stages or values for a defined period time, or transitioning therebetween. Typically, the two stages are referred to as a logical "0" state and a logical "1" state. Each digital signal is commonly referred to as a bit and several digital signals can be combined to produce a multi-bit digital signal with each bit having a different significance. For instance, the number seven may be represented by the 4-bit digital signal "0111" in which each of the bits from right to left represents an increasing power of 2 beginning with $2^0$ and the value of the bit, logical "0" or logical "1", indicating whether the associated power of 2 is used in representing the number 7. Consequently, the digital signal "0111" can be translated as $(0 \times 2^3)+(1 \times 2^2)+(1 \times 2^1)+(1 \times 2^0)=7$. In contrast, an analog signal is a signal that is capable of continuous variation. For example, a signal representative of air temperature over twenty-four hour period may vary continuously over a range of values during the twenty-four hour period.

Many applications require an analog signal to be converted into a representative or corresponding digital signal so that a digital computer, which is incapable of directly processing the analog signal, can process the information embodied in the analog signal. For instance, in many temperature control systems, an analog signal that is representative of the temperature at some point in the system must be converted into a digital signal so that at a digital controller can process the information in the analog signal and make the appropriate adjustments to the system. For example, the digital controller may cause the temperature at the aforementioned point in the system to be raised or lowered. To address this need, analog-to-digital (A/D) converters have been developed.

Analog-to-digital converters take an applied analog signal and convert it to a representative digital signal comprised of at least one bit, but more typically several bits, with each bit having either a logical "0" or a logical "1" value. For example, an analog signal of fourteen volts may be represented by the 4-bit digital signal "1110" and an analog signal of 7 volts may be represented by the digital signal "0111."

Several types of A/D converters are presently in existence. One type of A/D converter, known as a flash converter, determines the values or states of all the bits in the digital signal that is representative of an applied analog signal in one stage. Consequently, the values of all the bits are determined at substantially the same time. The flash converter operates by comparing the applied analog signal to a series of reference signals that are representative of all of the multi-bit digital signals in a defined range and then uses the result of the comparison to determine the value of the bits in the corresponding multi-bit digital signal. For instance, in a 4-bit flash converter, the analog signal is simultaneously compared to fifteen reference signals, with the fifteen reference signals dividing the input range into sixteen possible 4-bit combinations. The results of the fifteen comparisons are used to determine the 4-bit digital signal representative of the applied analog signal.

Another type of A/D converter known as a successive approximation A/D converter, uses a series of successive stages to determine the digital signal representative of an applied analog signal, with each stage determining only one bit of the digital signal. Stated another way, the successive approximation A/D converter determines the digital signal representative of an applied analog signal one bit at a time.

Yet a further type of A/D converter, known as a sub-ranging A/D converter, combines features of both the flash and successive approximation A/D converters. More specifically, the sub-ranging A/D converter utilizes a plurality of stages, like a successive approximation A/D converter, to determine the values of the multi-bit digital signal that is representative of the applied analog signal, with the initial stage determining the value of the most significant bit or bits in the multi-bit digital signal and the succeeding stages determining the values of progressively less significant bits of the multi-bit digital signal. Further, at least one of the stages of the sub-ranging A/D converter determines the values of a plurality of the bits of the digital signal at substantially the same time, just as with the flash A/D converter.

While the sub-ranging A/D converter provides a viable compromise between the high speed of flash A/D converters and the low speed of successive approximation A/D converters, there is still a desire to increase the speed of sub-ranging A/D converters. However, to increase conversion speed, presently known sub-ranging A/D converters require a substantial increase in power. The increase in power needed to achieve a corresponding increase in speed, in many applications, is undesirable. In addition to the desire to increase the conversion speed of sub-ranging A/D converters while avoiding substantial increases in power consumption, there is also a desire to simply conserve or reduce power consumption of sub-ranging A/D converters.

SUMMARY OF THE INVENTION

The present invention provides a sub-ranging A/D converter that exhibits improved conversion speed with little, if any, increase in power. This advantage was achieved by initially recognizing that at least one limiting factor in achieving greater speed in sub-ranging A/D converters without substantially increasing power is the resistor divider network used to provide reference signals to the comparators in the second and subsequent stages of the converter. Specifically, the resistance of the resistor divider network combined with the input capacitance of the comparators produces a time delay that limits the conversion speed of the converter. Present sub-ranging A/D converters address this speed limitation by increasing the power provided to the converter and, in particular, to the noted resistor divider network or networks. In contrast, the present invention increases the conversion speed of a sub-ranging A/D converter with little, if any, increase in power consumption and in many cases a reduction in power consumption relative to presently known sub-ranging A/D converters by substantially reducing the need for the noted resistor networks. Alternatively, a given conversion speed can be maintained while reducing power consumption.

One embodiment of the sub-ranging A/D converter of the present invention includes a first stage, a second stage and reference circuitry that uses information related to the values of the bit or bits determined by the first stage to determine a range of operation for the second stage. The second stage, unlike known sub-ranging A/D converters, employs a three-input comparator that reduces the need for a second stage resistor divider network. The three-input comparator includes a first input for receiving the upper limit of the range determined by the reference circuitry, a second input for receiving the lower limit of the range determined by the reference circuitry, and a third input for receiving the analog signal. The three-input comparator also includes an output for providing a signal that is representative of the relationship of the analog signal to the defined range. In one embodiment, the three-input comparator has an internally defined threshold within the specified range and the output of the comparator provides a signal that is representative of the relationship of the analog signal to the defined threshold level within the specified range. In a further embodiment, the need for a resistor-divider network is substantially eliminated by using a plurality of three-input comparators. Moreover, in presently known sub-ranging A/D converters, each of the second or subsequent stages of the converter include $(2^n-1)$ comparators for performing the requisite analog signal to digital signal conversion and additional comparators for use in performing digital error correction of the digital signal. In certain low resolution embodiments of the present invention (8-bits or less), the need for comparators for use in achieving digital error correction is eliminated. Stated another way, only $(2^n-1)$ comparators are needed to perform the conversion. This reduction in the number of comparators leads to a corresponding reduction in power consumption in such embodiments.

Another embodiment of the sub-ranging A/D converter of the present invention employs a three-input comparator that include a device for stabilizing the threshold level to aid in achieving more consistent conversions. Moreover, when a plurality of stabilized comparators are utilized, highly linear results are possible. Yet a further embodiment of the invention utilizes a three-input comparator that includes a device for defining a plurality of threshold levels within the specified range, thereby allowing a further reduction in the number of comparators needed by the second or subsequent stage of the converters from the noted $(2^n-1)$ converters and a further reduction in power consumption.

The present invention also provides a method for realizing a three-input comparator by using a weighted digital-to-analog (D/A) converter architecture. Presently, at least one weighted D/A converter architecture includes first and second inputs, each for receiving a digital signal, and a third input for receiving a constant reference signal. It has been found that by applying the lower and upper limits of a comparison range to the first and second inputs of the weighted D/A converter and the analog signal to the third input of the D/A converter, the weighted D/A converter architecture will process the inputs so as to output a comparison signal that is representative of the relationship of the applied analog signal to the comparison range. In one embodiment, the processing of the inputs to the weighted D/A converter includes defining a threshold level against which the analog signal is compared. In another embodiment of the method, the processing step includes defining a plurality of thresholds within the weighted A/D converter against which the analog signal can be compared. Further, by adjusting certain components of the weighted D/A converter, the threshold level can be adjusted.

DETAILED DESCRIPTION OF THE PREFERRED EMBODIMENT

Figure 1:
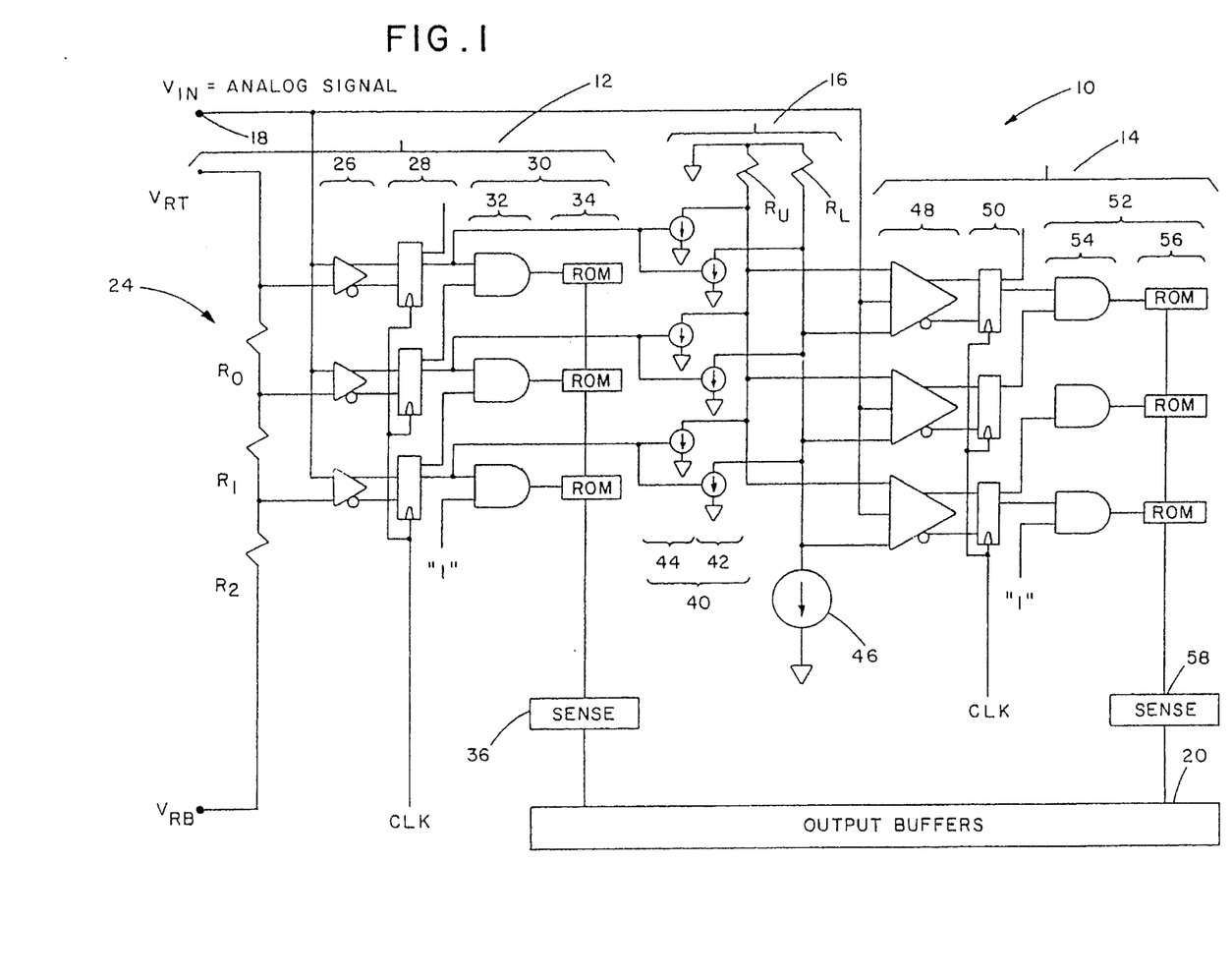
FIG. 1 illustrates one embodiment of a two-stage sub-ranging A/D converter of the present invention.

FIG. 1 illustrates a two-stage, 4-bit, sub-ranging analog-to-digital (A/D) converter 10, hereinafter referred to as converter 10, that embodies the present invention. It should be appreciated at the outset that the invention can be extended to sub-ranging A/D converters having a greater number of stages and/or providing digital signals comprised of a different number of bits. Generally, the converter 10 includes a first stage flash A/D converter 12, hereinafter referred as first stage 12, for determining the two most significant bits of a 4-bit digital signal that is representative of an analog signal applied to the converter 10. The converter 10 further includes a second stage flash A/D converter 14, hereinafter second stage 14, for determining the two least significant bits of the 4-bit digital signal representative of the applied analog signal. In addition, the converter 10 includes reference circuitry 16 for using information determined by the first stage 12 in defining a range of operation for the second stage 14. Analog port 18 is provided for receiving an analog signal $V_{IN}$ and applying the analog signal $V_{IN}$ to both the first stage 12 and the second stage 14. An output buffer 20 is provided for holding the 4-bit digital signal representative of the applied analog signal $V_{IN}$ that is determined by the first stage 12 and the second stage 14.

Briefly, operation of the converter 10 commences with the analog signal $V_{IN}$ being applied to the first stage 12. In response, the first stage 12 determines the two most significant bits of the 4-bit digital signal that is representative of the analog signal $V_{IN}$ and applies the two most significant bits to the output buffer 20. In the course of determining the two most significant bits of the digital signal, the first stage 12 also determines information on the range of the 4-bit digital signal that is representative of the analog signal. This information is conveyed by the reference circuitry 16 to the second stage 14. The second stage 14, like the first stage 12, receives the analog signal $V_{IN}$ via the analog port 18 and, using the range information provided by the matching circuitry 16, determines the two least significant bits of the 4-bit digital signal representative of the applied analog signal $V_{IN}$. The two least significant bits determined by the second stage 14 are then applied to the output buffer 20 to complete the conversion of the analog signal $V_{IN}$ to a 4-bit digital signal.

With the foregoing general background in mind, the converter 10 and its operation is now described in greater detail. The first stage 12 determines the two most significant bits of the 4-bit signal representative of the applied analog signal $V_{IN}$. The first stage 12 includes a reference resistor chain 24 comprised of resistors $R_0$–$R_2$, which are all located between a pair of terminals upon which a voltage is imposed that is equal to the difference between the voltage at the upper terminal $V_{RT}$ and the voltage at the lower terminal $V_{RB}$. The first stage 12 further includes a first plurality of comparators 26 for performing the three comparison operations necessary to determine the two most significant bits of the digital signal. Each comparator of the first plurality of comparators 26 includes a first input for receiving the analog signal $V_{IN}$, a second input for receiving a reference or threshold signal provided by the reference resistor chain 24, a first output for providing a digital signal representative whether the analog signal is greater than or less than the applied reference signal, and a second output that provides a digital signal which is the complement of the digital signal provided on the first output. Also included in the first stage is a first plurality of D-type flip-flops 28 for storing the digital signals output on the first and second outputs of the first plurality of comparators 26 and providing, upon a clock transition, these stored digital signals to the subsequent circuitry.

It is believed useful at this point to describe the operation of the reference resistor chain and the first plurality of comparators 26. The reference resistor chain 24 and the first plurality of comparators 26 operate to determine the relationship between the applied analog signal $V_{IN}$ and the three reference voltages provided by the reference resistor chain 24 that are used to determine which of the four possible values ("00", "01", "10", and "11") of the two most significant bits determined by the first stage 12 are most representative of the applied analog signal. More specifically, the reference resistor chain 24 and the first plurality of comparators 26 operate to identify the reference voltages that are greater than the analog signal $V_{IN}$ and/or the reference voltages that are less than the analog signal $V_{IN}$. For example, if the voltage of the analog signal $V_{IN}$ is greater than the voltage at the junction of resistors $R_1$ and $R_0$ but less than the voltage $V_{RT}$, the first plurality of comparators 26 will output a digital code of "011", which is stored by the first plurality of D-type flip-flops 28. Stated differently, the first plurality of comparators 26 outputs a thermometer code in which the comparators associated with a reference signal which the analog signal $V_{IN}$ exceeds each output a logical "1" while the remaining comparators that are associated with reference signals that the analog signal $V_{IN}$ does not exceed output a logical "0". Consequently, the output of the first plurality of comparators 26 outputs an increasing number of consecutive logical "1"'s and decreasing number of consecutive logical "0"'s for an increase in the analog signal $V_{IN}$ and vice versa for a decrease in the analog signals $V_{IN}$.

With the foregoing explanation of the operation of the reference resistor chain 24 and the first plurality of comparators 26 in mind, the first stage 12 also includes first encode circuitry 30 for resolving the 3-bit code output by the first plurality of comparators 26 and stored in the first plurality of D-type flip-flops 28 into the two most significant bits of the digital signal that is representative of the applied analog signal $V_{IN}$. To continue with the prior example, the first encode circuitry 30 would resolve the 3-bit code "011" into the two most significant bit code "10".

The first encode circuitry 30 includes a first plurality of AND-gates 32 that are responsive to the stored signals clocked out of the first plurality of D-type flip-flops 28. More specifically, each of the first plurality of AND-gates 32 receives the stored signal output by a corresponding one of the first plurality of D-type flip-flops 28 and the signal stored by an adjacent one of the first plurality of D-type flip-flops 28, with the exception of the last AND-gate, which is provided with a logical "1" signal. Each of the AND-gates 32, in response to the noted inputs, outputs a logical "1" if both inputs are a logical "1" and a logical "0" in all other cases. The first decode circuitry 30 also includes a first plurality of read-only memories (ROM) 34 that process the outputs of the first plurality of AND-gates 32 to determine the two most significant bits of the digital signal which is representative of the applied analog circuitry.

The reference circuitry 16, a dual-output digital-to-analog (D/A) converter, uses the range information determined by the first plurality of comparators 26 to establish the range of operation for the second stage 14. The reference circuitry 16 includes a plurality of switchable current sources 40 that are switched between an "ON" state and an "OFF" state depending upon the digital signal output by a corresponding one of the first plurality of comparators 26 and stored in the corresponding one of the first plurality of D-type flip-flops 28. The plurality of switchable current sources 40 is comprised of a first subset 42 that is used in conjunction with a resistor $R_L$ to define the lower limit of the range of operation for the second stage 14. Similarly, a second subset 44 of the plurality of switchable current sources is used in combination with resistor $R_U$ to define the upper limit of the range of operation for the second stage 14. The reference circuitry 16 also includes an offset current source 46 that establishes an offset between the lower and upper limits of the range equivalent to the value of the least significant bit determined by the first stage 12. The offset current source 46, in contrast to the other current sources, is not switched and, as a consequence, provides current throughout a conversion operation.

When the reference circuitry 16 is in operation, the current sources associated with the first subset 42 are turned "ON" or "OFF" when the digital signals produced by the first plurality of comparators 26 are clocked out of the first plurality of D-type flip-flops 28. Likewise, the current sources comprising the second subset 44 are turned "ON" or "OFF" when the digital signals produced by the first plurality of comparators 26 are clocked out of the first plurality of D-type of flip-flops 28. The offset current source 46 provides the requisite offset between the lower and upper limits of the range equivalent to the value of the least significant bit determined by the first stage 12. To demonstrate the operation of the plurality of switchable current sensors 40 and continuing with the prior example, when the digital code "011" is clocked out of the first plurality of D-type flip-flops 28, the matching circuitry 16 causes the current source of the first subset 42 associated with the "0" portion of the digital code "011" to be turned "OFF" and the remaining current sources of the first subset 42 to be turned "ON" due to their association with the "11" portion of the digital code "011". The three current sources of the first subset 42 that are turned "ON" and the offset current source 46 cooperate with the resistor $R_L$ to produce a voltage signal that defines the lower limit of the range of operation for the second stage 14. Similarly, the reference circuitry 16 uses the "0" portion of the digital code "011" to turn "OFF" the associated one of the current sources of the second subset 44 and the "11" portion of the digital code "011" to turn "ON" all of the remaining current sources of the second subset 44. The three current sources of the second subset 44 that have been turned "ON" cooperate with the resistor $R_U$ to define a voltage signal that is representative of the upper limit of the range of operation for the second stage 14. In essence, the reference circuitry 16 is operating to inform the second stage 14 of the appropriate operating range to determine the two least significant bits of 4-bit digital signal representative of the analog signal $V_{IN}$.

The second stage 14 determines the two least significant bits of the 4-bit signal representative of the applied analog signal $V_{IN}$. The second stage includes a second plurality of three-input comparators 48. Each of the comparators 48 operates to produce a digital signal that is representative of the relationship of the analog signal $V_{IN}$ to the range of operation conveyed by the reference circuitry 16. More specifically, each of the comparators 48 produces an output signal that is representative of the relationship of the analog signal $V_{IN}$ to a threshold level within the defined range and defined within each comparator. The threshold level of each of the second plurality of comparators 48 serves essentially the same function as one of the reference signals provided by the reference resistor chain 24 to one of the first plurality of comparators. Each of the second plurality of comparators 48 includes a first input for receiving a signal representative of the lower limit of the range of operation, a second input for receiving a signal representative of the upper limit of the range of operation, an a third input for receiving the analog signal $V_{IN}$. Each of the comparators 48 has a different threshold level within the defined range of operation with respect to which the analog signal $V_{IN}$ is compared. The various threshold levels correspond to the three dividing points in the range of operation that separate two of the four possible 2-bit codes within the specified range from one another. In addition, each of the comparators 48 includes a first output for providing a digital signal that is representative of the relationship of the analog signal $V_{IN}$ to the defined threshold level associated with the comparator and a second output for providing a complementary signal to the digital signal provided on the first output. It should also be noted that with respect to the 4-bit converter 10 no digital error correction comparators are needed. Consequently, only three of the three-input comparators are necessary to determine the two bits output by the second stage. More generally only $(2^n-1)$ comparators, where n is the number of bits determined by a stage, are necessary to determine the number of bits output by the second stage or a subsequent stage for low resolution embodiments of the converters, which are presently converters that are 8-bits or less.

The second stage 14 also includes a second plurality of D-type flip-flops 50 for storing the digital signals produced by the second plurality of comparators 48 and outputting these signals to subsequent circuitry in the second stage based upon a clock signal.

Further included in the second stage 14 is second encode circuitry 52 that resolves the digital signal produced by the second plurality of comparators 48 and stored in the second plurality of D-type flip-flops into the two least significant bits of the 4-bit digital signal that is representative of the applied analog signal $V_{IN}$. The second decode circuitry 52 includes a second plurality of AND-gates 54 that are each responsive to the digital signal output by a corresponding one of the second plurality of comparators 48 and the digital signal output by the adjacent one of the second plurality of comparators 48 to the corresponding comparator, with the exception of the last AND-gate, which is provided with a logical "1" signal. Each of the AND-gates 54, in response to the noted inputs, outputs a logical "1" if both inputs are a logical "1" and a logical "0" in all other cases. In addition, the decode circuitry 52 includes a second plurality of readonly memories (ROM) 56 that, in cooperation with one another and in response to the digital signals output by the second plurality AND-gates 54, resolve the digital signal produced by the second plurality of comparators 48 into the two least significant bits of the digital signal that is representative of the applied analog signal $V_{IN}$.

A second sensor 58 is included in the second stage 14 to transmit the two least significant bits of the digital signal determined by the second plurality of ROMS 56 to the output buffer 20 thereby completing the conversion of the analog signal $V_{IN}$ into a digital signal.

Operation of the second stage 14 commences with the voltage signals representative of the upper and lower limits of the range of operation for the second stage being applied to each of the second plurality of comparators 48 together with the analog signal $V_{IN}$. Each of the second plurality comparators 48 compares the applied analog signal to a threshold level and outputs a digital signal and a complementary digital signal representative of whether the applied analog signal is greater than or less than the threshold level associated with the comparator. The entire second plurality of comparators 48 outputs a 3-bit thermometer code akin to the thermometer code output by the first plurality of comparators 26. The output signals produced by the second plurality of comparators 48 are then applied to, and stored in, the second plurality of D-type flip-flops 50. The digital signals stored in the second plurality of D-type flip-flops 50 are subsequently output to the second encode circuitry 52. The second encode circuitry 52 operates upon the digital signals output by the second plurality of D-type flip-flips 50 to determine the two least significant bits of the 4-bit digital signal that is representative of the applied analog signal $V_{IN}$. The two least significant bits of the digital signal produced by the second decode circuitry 52 are then conveyed to the output buffer 20 via the sensor 58.

Briefly, operation of the second stage 14 in the context of the foregoing example involves each of the second plurality of comparators 48 being provided with voltage signals representative of the lower limit of the range of operation ("1000") and the upper limit of the range of operation ("1100") by the reference circuitry 16. The threshold levels in the second plurality of comparators 48 represent the three dividing points within the specified range that separate two of the four possible 2-bit codes in the specified range from one another. Specifically, the threshold levels will represent dividing points between the codes "1000" and "1001", codes "1001" and "1010" and codes "1010" and "1011". The second plurality of comparators 48 then outputs digital signals representative of the relationship of the applied analog signal $V_{IN}$ to the various threshold levels. In this instance, the second plurality of comparators 48 outputs the digital signal "0000" to the second plurality of D-type flip-flops 50. Subsequently, the digital signal "0000" is clocked out of the D-type flip-flops and resolved by the second encoding circuitry 52 into the two least significant bits "00" representative of the applied analog signal $V_{IN}$. The two least significant bits "00" are then conveyed by the sensor 58 to the output buffers 20 to complete the analog-to-digital conversion of the applied analog signal to a 4-bit digital signal "1000" Further, the conversion is accomplished in a manner that substantially prevents mismatch or wrap-around error.

Figure 2:
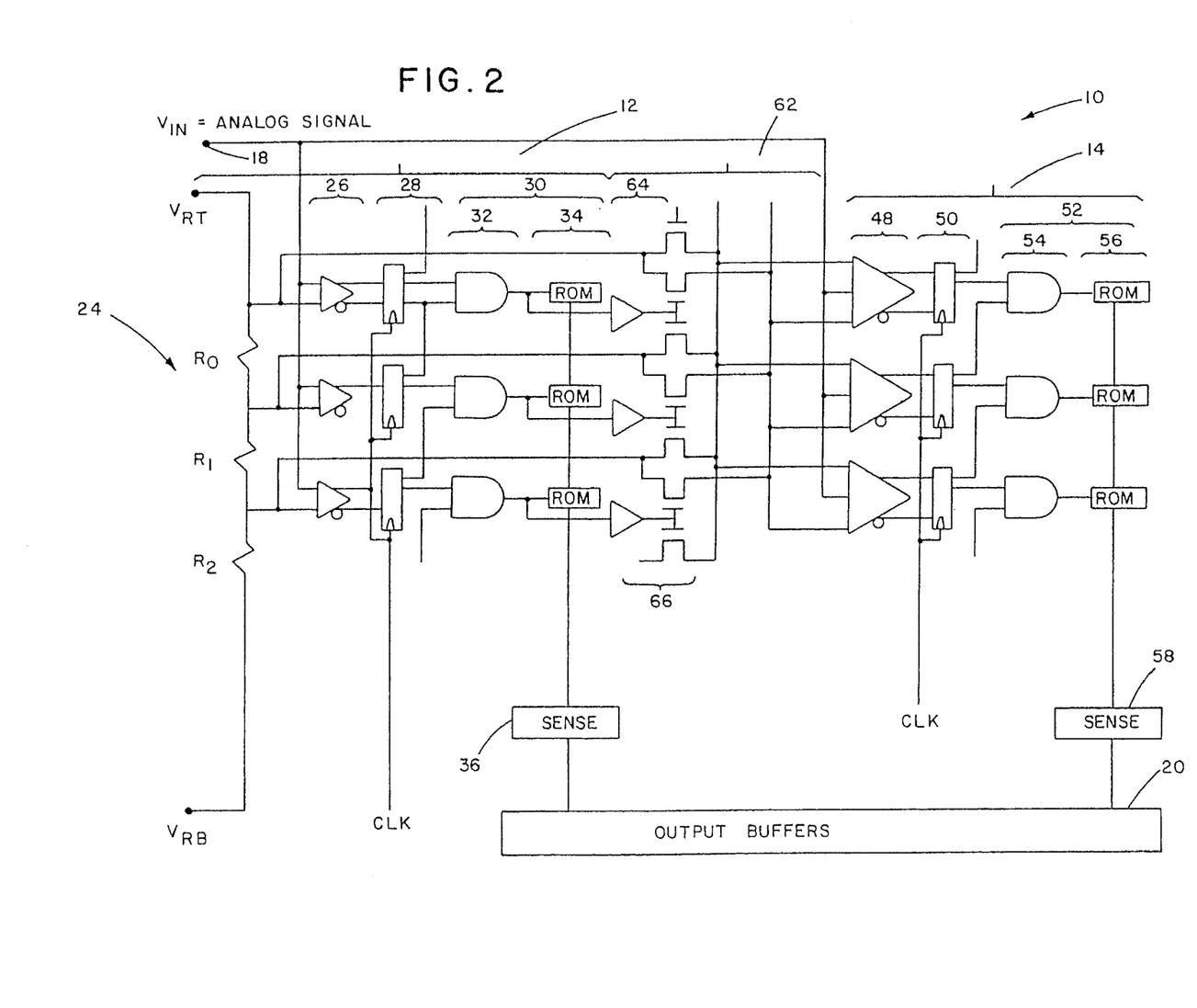
FIG. 2 illustrates a second embodiment of the two-stage sub-ranging A/D converter of the present invention.

With reference to FIG. 2, a second embodiment of the sub-ranging A/D converter 10 of the present invention is illustrated. The second embodiment of the converter 10, with the exception of the reference circuitry, is identical to the first embodiment of the converter 10 illustrated in FIG. 1. As a consequence, those portions of the second embodiment of the converter 10 that correspond to the first embodiment of the converter 10 bear the same reference numbers.

The second embodiment of the converter 10, like the first embodiment, includes a first stage 12 and second stage 14 that are used to determine the 4-bit digital signal that is representative of the applied analog signal $V_{IN}$. Since the first stage 12 and the second stage 14 are identical to those in the first embodiment, neither their structure or operation will be described.

The second embodiment of the converter 10, like the first embodiment, also includes reference circuitry for using information determined by the first stage 12 to define the range of operation of the second stage 14. However, due to the difference between the reference circuitry of the second embodiment and the reference circuitry 16 in the first embodiment, the reference circuitry of the second embodiment is identified as reference circuitry 62.

Reference circuitry 62, in contrast to reference circuitry 16, directly switches voltages from the reference resistor chain 24 to the second stage to define the range of operation of the second stage. The reference circuitry 62 includes a plurality of inverters 64. Each one of the plurality of inverters 64 is associated with a corresponding one of the first plurality of AND-gates 32 and operates to output a digital signal that is inverted with respect to the digital signal output by the corresponding AND-gate.

The reference circuitry 62 also includes a plurality of N-channel FET switches that, in response to the signals output by the plurality of inverters 64, apply reference voltage signals from the reference resistor chain 24 to the second stage 14 that define the lower and upper limits of the range of operation for the second stage 14. More specifically, each of the plurality of inverters 64 controls the state of two of the plurality of FET switches 66. One of the two FET switches is used in defining the upper limit of the range. If this FET switch is placed in an "ON" state by the associated inverter, the reference signal utilized by the corresponding one of the first plurality of comparators 28 is used in defining the upper limit. If, on the other hand, the FET switch is placed in an "OFF" state by the associated inverter, the upper limit is defined not to include the corresponding reference signal. The other FET switch associated with an inverter is used in defining the lower limit of the range. If this FET switch is placed in an "ON" state by the associated inverter, the reference signal utilized by the adjacent comparator of the first plurality of comparators 26 is used in defining the lower limit. In contrast, if the FET switch is placed in an "OFF" state by the corresponding inverter, the lower limit is defined not to include the reference signal utilized by the adjacent comparator.

When the reference circuitry 62 is in operation, each of the inverters of the plurality of inverters 64 inverts the digital signal output by a corresponding one of the first plurality of AND-gates 32 and applies the inverted signal to two of the plurality of FET switches 66 to either turn the FET switches "ON" or "OFF". The FET switches, in response, select voltages from the reference resistor chain 24 to define the upper and lower limits of operation for the second stage 14.

Figure 3A:
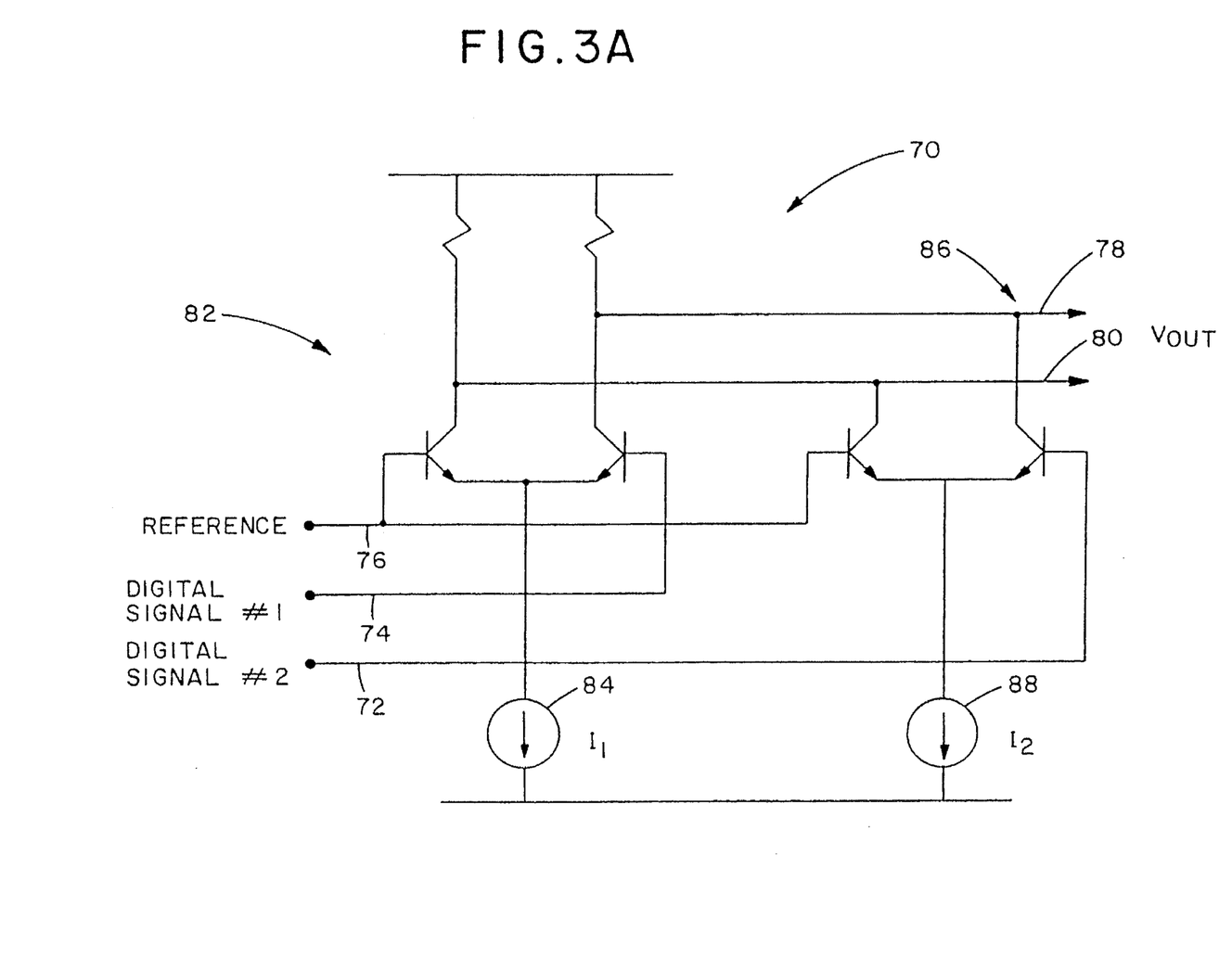
FIG. 3A illustrates a weighted digital-to-analog converter architecture.

With reference to FIG. 3A, a weighted digital-to-analog (D/A) converter, hereinafter weighted converter 70, that can be adapted to function as a 3-input comparator suitable for use in the converter 10, is illustrated. The weighted converter 70 includes a first input port 72 and a second input port 74 that, when the weighted converter 70 is being used as a D/A converter, each receive a digital signal, and a third input port 76 for receiving a reference signal. The weighted converter 70 further includes a first output port 78 and a second output port 80 that combine to provide a weighted analog output signal that is representative of the digital signals applied at the first and second input ports 72, 74 when the weighted converter is being used as a D/A converter. Also included in the weighted converter 70 is a first emitter coupled differential amplifier 82 that includes a first current source 84 and a second emitter coupled differential amplifier 86 that includes a second current source 88. The amount of current output by the first current source 84 and second current source 88 determine the weighting of the signals at the first output port 78 and the second output port 80.

Figure 3B:
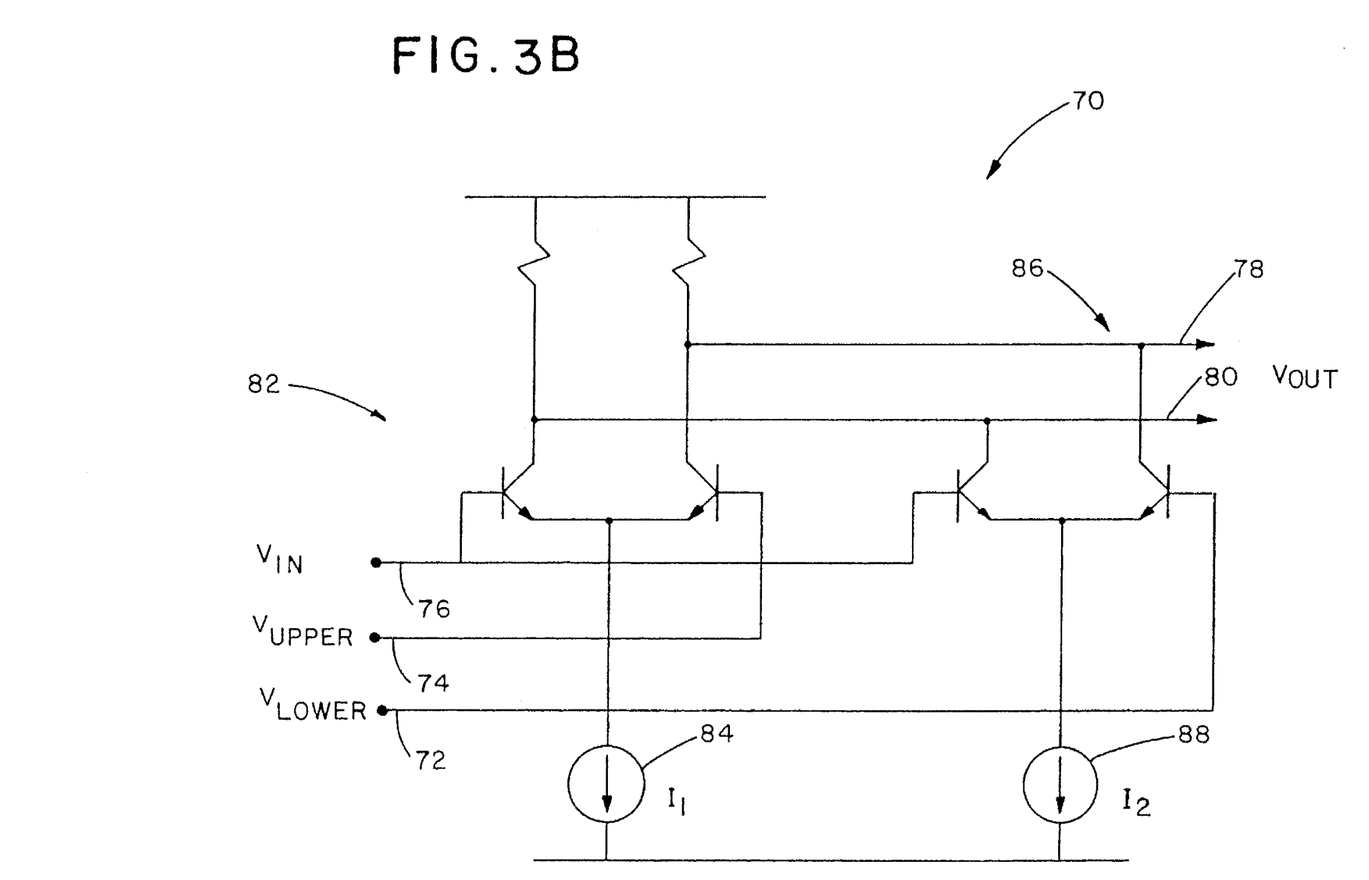
FIG. 3B illustrates a weighted digital-to-analog converter that has been adapted for use as a 3-input comparator with an internally defined threshold level.

With reference to FIG. 3B, it has been discovered that the weighted digital-to-analog architecture illustrated in FIG. 3A can be adapted to become a comparator suitable for use in the second stage 14 of the converter 10. Specifically, the weighted converter 70 can be made into a comparator by applying the voltage signal representative of the lower limit of the range of operation produced by the reference circuitry 16 or 62 to the first input port 72; the voltage signal representative of the upper limit of the range of operation to the second input port 74; and the analog input signal $V_{IN}$ to the third input port 76. Further, a threshold level to which the analog input signal $V_{IN}$ can be compared can be realized by adjusting the ratio of the currents provided by the first current source 84 and the second current source 88. For example, if the current output by the first current source 84 and the second current source 88 are substantially equal, then a threshold level is defined that is substantially midway between the range of operation defined by the voltage signals representative of the lower and upper limits of the range of operation. Changing the ratio of the currents moves the threshold level up or down within the range. As a consequence, when the weighted converter 70 is utilized to realize each of the comparators of the second plurality of comparators 48 in the second stage 14, the ratio of the currents is different for each of the comparators.

Figure 4:
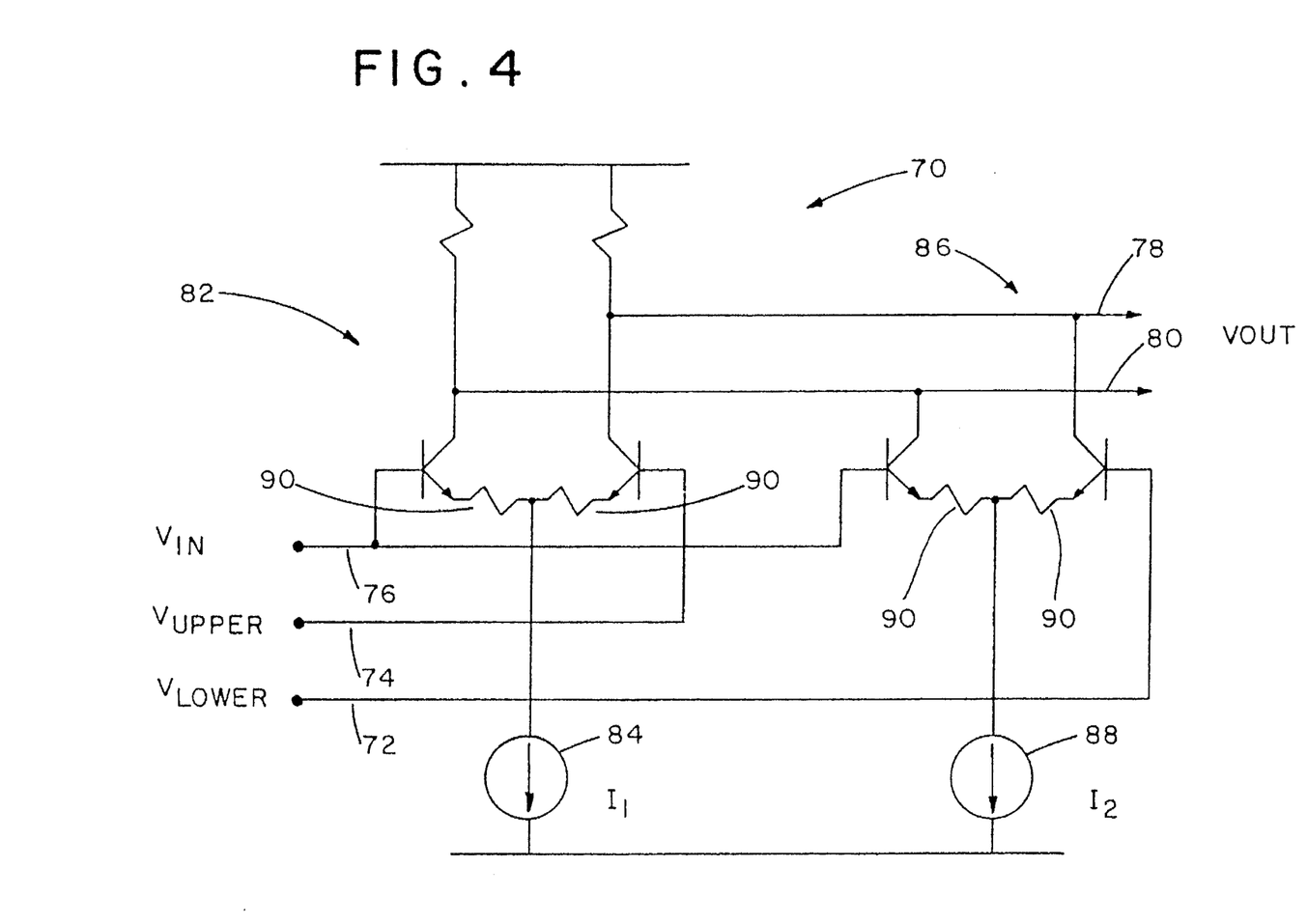
FIG. 4 illustrates a weighted digital-to-analog converter architecture that has been adapted to perform as a three-input comparator and includes emitter resistors in the differential amplifiers to improve the linearity of the bank of three-input comparators used in the second stage of the sub-ranging A/D converter illustrated in FIGS. 1 and 2.

With reference to FIG. 4, another embodiment of the weighted converter 70 that is suitable for use as a comparator in the second stage 14 of the converter 10 is illustrated. In contrast to the comparator illustrated in FIG. 3B, the comparator illustrated in FIG. 4 includes emitter resistors 90 in the first differential amplifier 82 and the second differential amplifier 86. The emitter resistors 90 provide a relatively high degree of control over the stability of the threshold level. Consequently, when the comparator 70 illustrated in FIG. 4 is used with like comparators in the second stage 14, a relatively high degree of linearity between the threshold levels is possible, i.e., substantially equal spacing between the threshold levels is possible.

The foregoing description of the invention has been presented for purposes of illustration and description. Further, the description is not intended to limit the invention to the form disclosed herein. Consequently, variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternate embodiments to the extent permitted by the prior art.

What is claimed is:

1. An analog-to-digital converter comprising:
    first means for performing a first analog-to-digital conversion on an analog signal to determine at least a first bit of a multi-bit digital signal that is representative of the analog signal;

means for determining a range of values for said multi-bit digital signal using information relating to the value of said first bit, said range having an upper limit and a lower limit; and second means, operating within said range of values provided by said means for determining, for performing a second analog-to-digital conversion on the analog signal to determine n-bits of said multi-bit digital signal that are each less significant than said first bit, said n-bits being capable of taking on $2^n$ combinations of n-bit codes, said second means including means for reducing the need for a chain of resistors to provide reference signals for said second analog-to-digital conversion.

2. An analog-to-digital converter, as claimed in claim 1, wherein:

said means for reducing includes a comparator with first input for receiving said lower limit, a second input for receiving said upper limit, a third input for receiving said analog signal, and an output for providing a signal that is representative of the relationship of said analog signal to said range defined by said upper limit and said lower limit.

3. An analog-to-digital converter, as claimed in claim 2, wherein:

said comparator includes means for defining a threshold level within said range of values defined by said upper limit and said lower limit, and said output provides a signal that is representative of the relationship of said analog signal to said threshold level.

4. An analog-to-digital converter, as claimed in claim 2, wherein:

said comparator includes a plurality of power sources for defining a threshold level within said range of values defined by said upper limit and said lower limit.

5. An analog-to-digital converter, as claimed in claim 2, wherein:

said comparator includes a plurality of current sources for defining a threshold level within said range of values defined by said upper limit and said lower limit.

6. An analog-to-digital converter, as claimed in claim 2, wherein:

said comparator includes means for defining a threshold level within said range of values defined by said upper limit and said lower limit and means for stabilizing said threshold level.

7. An analog-to-digital converter, as claimed in claim 2, wherein:

said means for reducing includes no more than $(2^n-1)$ of said comparator for comparing said analog signal to threshold levels within said range.

8. An analog-to-digital converter, as claimed in claim 2, wherein:

said output of said comparator includes a first output for providing a first signal that is representative of the relationship of said analog signal to said range defined by said upper limit and said lower limit and a second output for providing a second signal that is the complement of said first signal.

9. An analog-to-digital converter, as claimed in claim 1, wherein:

said means for determining includes a current summing digital-to-analog converter.

10. An analog-to-digital converter, as claimed in claim 1, wherein:

said means for determining includes a switchable current source.

11. An analog-to-digital converter, as claimed in claim 1, wherein:

said means for determining includes a switch that is responsive to a signal that is representative of said first bit.

12. An analog-to-digital converter, as claimed in claim 1, wherein:

said means for determining includes switch means, responsive to the value of said first bit, for selectively sampling a reference signal used by said first means.

13. An analog-to-digital converter, as claimed in claim 1, wherein:

said first means includes means for providing a plurality of reference signals; and said means for determining includes switch means, responsive to the value of said first bit, for selectively sampling one of said plurality of reference signals.

14. An analog-to-digital converter, as claimed in claim 1, wherein:

said first means for performing a first analog-to-digital conversion includes a flash analog-to-digital converter for determining at least two bits of said multi-bit digital signal;

said means for determining includes a digital-to-analog converter; and said second means for performing a second analog-to-digital conversion includes a flash analog-to-digital converter.

15. An analog-to-digital converter comprising:

a first flash converter for performing a first analog-to-digital conversion on an analog signal to determine a first plurality of bits of a multi-bit signal that is representative of the analog signal;

means, responsive to information relating to said first plurality of bits of said multi-bit signal, for determining a range of values for said multi-bit signal, said range having a lower limit and an upper limit; and a second flash converter for performing a second analog-to-digital conversion on the analog signal to determine a second plurality of bits of said multi-bit signal that are less significant than said first plurality of bits, said second flash converter including a plurality of comparators with each of said plurality of comparators including a first input for receiving said lower limit, a second input for receiving said upper limit, a third input for receiving said analog signal, means for defining a threshold value within said range of values defined by said upper limit and said lower limit, and an output for providing a signal that is representative of the relationship of said analog signal to said threshold level.

16. A comparator for providing an output signal that is indicative of the relationship of an analog input signal to a threshold level that is in a defined range comprising:

means for receiving an analog input signal, a first signal that represents an upper limit of a comparison range, and a second signal that represents a lower limit of said comparison range;

means for defining a threshold level located between said upper limit and said lower limit of said comparison range; and means for processing said analog input signal, said first signal, said second signal and said threshold level to provide an output signal that is indicative of the relationship of said analog input signal to said threshold level said that is located between said upper limit and said lower limit of said comparison range, wherein said output signal has a first state when said analog input signal is greater than said threshold level and a second state that is different than said first state when said analog input signal is less than said threshold level.

17. A comparator, as claimed in claim 16, wherein:

said means for defining a threshold level includes a current source.

18. A comparator, as claimed in claim 16, wherein:

said means for defining a threshold level includes a first current source for providing a first current and a second current source for providing a second current, said threshold level defined by the relationship of said first current to said second current.

19. A comparator, as claimed in claim 16, wherein:

said means for defining a threshold level includes means for stabilizing said threshold level.

20. A comparator, as claimed in claim 16, wherein:

said means for processing includes a differential amplifier.

21. A comparator, as claimed in claim 16, wherein:

said means for processing includes an emitter coupled differential amplifier.

22. A comparator, as claimed in claim 16, wherein:

said means for processing includes two differential amplifiers.

23. A comparator, as claimed in claim 16, wherein:

said means for processing includes two emitter coupled differential amplifiers.

24. A method for using a weighted digital-to-analog converter as a comparator comprising the steps of:

providing a weighted digital-to-analog converter that includes a first input for receiving a first digital signal and a second input for receiving a second digital signal, a third input for receiving a reference signal, and an output for providing an analog signal that is representative of said first digital signal and said second digital signal;

applying a first limit signal that defines an upper limit of a comparison range, rather than said first digital signal, to said first input;

applying a second limit signal that defines a lower limit of a comparison range, rather than said second digital signal, to said second input;

applying a first comparison signal, rather than said reference signal, to said third input;

processing said first limit signal, said second limit signal, and said first comparison signal with said weighted digital-to-analog converter to produce a second comparison signal that represents a relationship between said first comparison signal and said range.

25. A method, as claimed in claim 24, wherein:

said step of processing includes defining a threshold level within said range, said second comparison signal representing a relationship of said first comparison signal to said threshold level.

26. A method, as claimed in claim 24, wherein:

said step of processing includes defining, using a current source, a threshold level against which said first comparison signal can be compared to produce said second comparison signal.

27. A method, as claimed in claim 24, wherein:

said step of processing includes using a first differential amplifier and a second differential amplifier.

28. A method, as claimed in claim 24, wherein:

said step of processing includes using a first emitter coupled differential amplifier and a second emitter coupled differential amplifier.

29. A method, as claimed in claim 24, wherein:

said step of processing includes using a first emitter coupled differential amplifier with emitter resistors and a second emitter coupled differential amplifier with emitter resistors.

30. A comparator, as claimed in claim 16, wherein:

said means for processing includes a first transistor with a first base and a first collector, and a second transistor with a second base and a second collector;

wherein said means for receiving conveys said analog input signal to said first base and said second base; and said first collector is operatively connected to said second collector.

31. A comparator, as claimed in claim 16, wherein:

said means for processing includes a first transistor with a first base and a first collector, and a second transistor with a second base and a second collector;

wherein said means for receiving conveys said first signal to said first base;

said means for receiving conveys said second signal to said second base; and said first collector is operatively connected to said second collector.

32. A comparator, as claimed in claim 16, wherein:

said means for processing includes a first transistor with a first base and a first collector, and a second transistor with a second base and a second collector, and a third transistor with a third base and a third collector, and a fourth transistor with a fourth base and a fourth collector;

wherein said means for receiving conveys said analog input signal to said first base and said second base;

wherein said first collector is operatively connected to said second collector;

wherein said means for receiving conveys said first signal to said third base;

wherein said means for receiving conveys said second signal to said fourth base; and said third collector is operatively connected to said fourth collector.

33. A comparator, as claimed in claim 16, wherein:

said means for processing includes a first transistor with a first base, a first collector, and a first emitter, and a second transistor with a second base, a second collector, and a second emitter, and a third transistor with a third base, a third collector, and a third emitter, and a fourth transistor with a fourth base, a fourth collector, and a fourth emitter;

said means for defining a threshold includes a first current source and a second current source;

wherein said means for receiving conveys said analog input signal to said first base and said second base;

wherein said first collector is operatively connected to said second collector;

wherein said means for receiving conveys said first signal to said third base;

wherein said means for receiving conveys said second signal to said fourth base;

wherein said third collector is operatively connected to said fourth collector;

wherein said first emitter and said third emitter are operatively connected to said first current source; and wherein said second emitter and said fourth emitter are operatively connected to said second current source.

34. A comparator, as claimed in claim 33, wherein:

said means for defining includes a first resistor that is operatively connected to said first emitter, a second resistor that is operatively connected to said second emitter, a third resistor that is operatively connected to said third emitter, and a fourth resistor that is operatively connected to said fourth emitter.

35. A comparator, as claimed in claim 16, wherein:

said means for defining a threshold level includes a resistor; and said means for processing includes a transistor with an emitter;

wherein said resistor is operatively connected to said emitter.

36. A comparator, as claimed in claim 16, wherein:

said means for defining includes a first resistor and a second resistor;

said means for processing includes a first transistor with a first emitter and a second transistor with a second emitter;

wherein said first resistor is operatively connected to said first emitter; and wherein said second resistor is operatively connected to said second emitter.

37. A comparator, as claimed in claim 16, wherein:

said means for defining includes a first resistor, a second resistor, a third resistor, and a fourth resistor;

said means for processing includes a first transistor with a first emitter, a second transistor with a second emitter, a third transistor with a third emitter, and a fourth transistor with a fourth emitter;

wherein said first resistor is operatively connected to said first emitter, said second resistor is operatively connected to said second emitter, said third resistor is operatively connected to said third emitter, and said fourth resistor is operatively connected to said fourth emitter.

38. A comparator, as claimed in claim 16, wherein:

said means for processing includes a first resistor and a second resistor.

39. A comparator, as claimed in claim 16, wherein:

said means for processing includes a first resistor, a second resistor, a first transistor, a second transistor;

wherein said first resistor is operatively connected to said first transistor and said second resistor is operatively connected to said second transistor.

* * * * *